US007550365B2

(12) United States Patent
Emery et al.

(10) Patent No.: US 7,550,365 B2
(45) Date of Patent: Jun. 23, 2009

(54) BONDING STRUCTURE AND METHOD OF MAKING

(75) Inventors: Timothy R. Emery, Corvallis, OR (US); William J. Edwards, Albany, OR (US); Donald W. Schulte, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 571 days.

(21) Appl. No.: 11/045,531

(22) Filed: Jan. 27, 2005

(65) Prior Publication Data

US 2005/0146565 A1 Jul. 7, 2005

Related U.S. Application Data

(62) Division of application No. 10/123,510, filed on Apr. 15, 2002, now Pat. No. 6,871,942.

(51) Int. Cl.
*H01L 21/20* (2006.01)

(52) U.S. Cl. ....................... 438/455; 438/456; 438/495; 257/E23.077; 257/E21.567

(58) Field of Classification Search ................. 438/455, 438/257, 456, 150, 149, 459; 257/E21.334, 257/E21.705, E21.499

See application file for complete search history.

(56) References Cited

U.S. PATENT DOCUMENTS

| | | | | |
|---|---|---|---|---|
| 3,852,563 A | | 12/1974 | Bohorquez et al. | |
| 4,329,698 A | | 5/1982 | Smith | |
| 4,438,191 A | | 3/1984 | Cloutier et al. | |
| 4,500,895 A | | 2/1985 | Buck et al. | |
| 4,651,406 A | * | 3/1987 | Shimizu et al. | 438/275 |
| 4,749,291 A | | 6/1988 | Kobayashi et al. | |
| 4,771,295 A | | 9/1988 | Baker et al. | |
| 4,794,409 A | | 12/1988 | Cowger et al. | |
| 4,847,630 A | | 7/1989 | Bhaskar et al. | |
| 4,851,371 A | | 7/1989 | Fisher et al. | |
| 4,875,968 A | | 10/1989 | O'Neill et al. | |
| 4,894,664 A | | 1/1990 | Tsung Pan | |
| 4,929,969 A | | 5/1990 | Morris | |
| 4,998,665 A | * | 3/1991 | Hayashi | 228/180.1 |
| 5,041,190 A | | 8/1991 | Drake et al. | |
| 5,084,124 A | | 1/1992 | Taniguchi | |
| 5,160,577 A | | 11/1992 | Deshpande | |
| 5,187,500 A | | 2/1993 | Bohorquez et al. | |
| 5,278,584 A | | 1/1994 | Keefe et al. | |
| 5,308,442 A | | 5/1994 | Taub et al. | |
| 5,317,346 A | | 5/1994 | Garcia | |
| 5,382,505 A | | 1/1995 | Schmidt et al. | |
| 5,443,713 A | | 8/1995 | Hindman | |
| 5,731,828 A | | 3/1998 | Ishinaga et al. | |
| 5,904,546 A | * | 5/1999 | Wood et al. | 438/460 |
| 6,219,908 B1 | * | 4/2001 | Farnworth et al. | 29/833 |
| 6,238,998 B1 | * | 5/2001 | Leobandung | 438/404 |
| 6,406,636 B1 | * | 6/2002 | Vaganov | 216/2 |
| 6,437,400 B2 | * | 8/2002 | Leobandung | 257/329 |
| 6,548,322 B1 | * | 4/2003 | Stemme et al. | 438/57 |
| 6,590,258 B2 | * | 7/2003 | Divakauni et al. | 257/347 |
| 6,673,189 B2 | * | 1/2004 | Gerss et al. | 156/276 |
| 6,969,667 B2 | * | 11/2005 | Liebeskind et al. | 438/455 |
| 2004/0157407 A1 | * | 8/2004 | Tong et al. | 438/455 |

* cited by examiner

*Primary Examiner*—Michael S Lebentritt

(57) ABSTRACT

An electrical device includes an interconnect and a pair substrates at least one of which includes an integrated circuit, the pair of substrates being bonded together by a bond that includes a structure having multiple widths and a composition that is selected from the group consisting of a graded material and a first material upon a second material.

4 Claims, 10 Drawing Sheets

BONDING STRUCTURE AND METHOD OF MAKING

RELATED PATENT DATA

This patent resulted from a divisional of and claims priority to U.S. patent application Ser. No. 10/123,510, filed on Apr. 15, 2002 now U.S. Pat. No. 6,871,942, entitled "Bonding Structure and Method of Making" naming Timothy R. Emery, William J. Edwards, and Donald W. Schulte as inventors, the disclosure of which is incorporated herein by reference.

FIELD OF THE INVENTION

The present invention relates to bonding, and is more particularly related to a bonding structure and method of making.

BACKGROUND OF THE INVENTION

In large scale integration, electrical devices such as complementary metal-oxide semiconductor (CMOS) circuitry are fabricated in large quantities on substrates. These substrates can be bonded together using microfabrication techniques to efficiently manufacture micromachined structures. In the case of wafer level packaging, a problem can occur in the hermetic or gas impervious sealed region. Particularly, the bonding process may be lacking in integrity such that the wafers separate one from another. It would be an advantage in the art to provide a good bond between wafers to prevent a breaching of the sealed region there between in wafer level packaged die.

In the case of thermal ink jet (TIJ) printing, a fluid ejection device, such as a print head, is fabricated to have materials surrounding a firing chamber with underlying thin films. Conductive traces and other structures are also in the print head which is formed into a die in the fabrication process. It would be an advance in the art to provide good adhesion and prevent detachment and/or delamination of the materials surrounding the firing chamber from the underlying thin films, so as to thereby protect conductive traces and other structures in the print head die from ink corrosion.

SUMMARY OF THE INVENTION

In one embodiment, an electrical device includes an interconnect and a pair substrates at least one of which includes an integrated circuit, the pair of substrates being bonded together by a bond that includes a structure having multiple widths and a composition selected from the group consisting of a graded material and a first material upon a second material.

DESCRIPTION OF THE DRAWINGS

A more particular description of the invention is rendered by reference to specific embodiments thereof which are illustrated in the appended drawings. The same numbers are used throughout the drawings to reference like features and components. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Figure 1A:
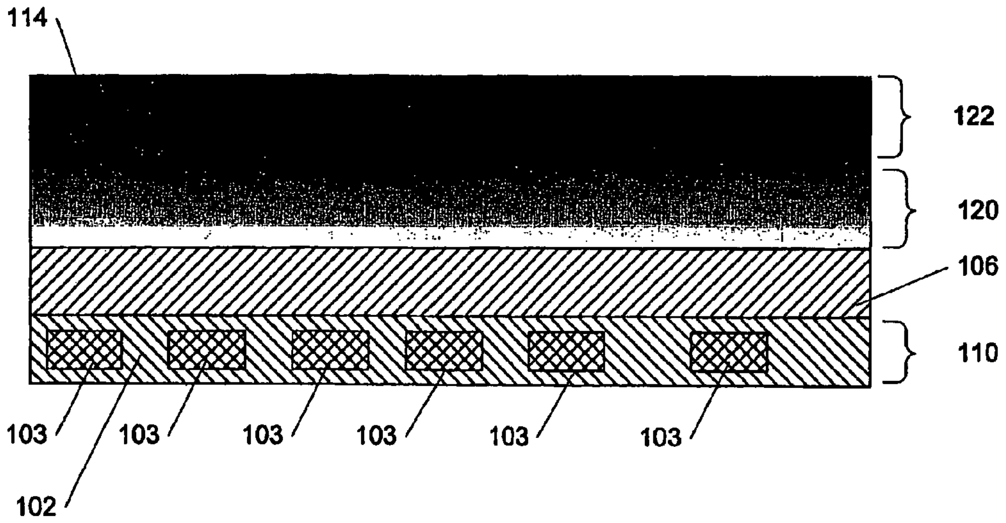
FIGS. 1*a*-1*b* are respective cross-sectional cutaway views, each being an embodiment of the invention depicting a portion of a wafer having fabricated therein a plurality of integrated circuits and that is to be bonded to another wafer using, respectively, a graded stack or a graded dielectric layer, which stack or layer is to be fabricated so as to provide good adhesion to the other wafer.

An embodiment of the invention is an electrical device that includes a pair of substrates that are bonded together by use of a bonding structure. The bonded substrates can optionally be designed to have a sealed region there between. A plurality of integrated circuits are fabricated on one or both of the substrates. The integrated circuits can be exposed to the optional sealed region, either directly or through one or more passageways in fluid communication therewith. The sealed region, which can be a gas impervious region or a hermetically sealed region, prevents ambient gases from outside the substrates from entering into the region. The sealed region is situated between the pair of bonded substrates. In one embodiment of the invention, the sealed region is a substantial vacuum. In another embodiment of the invention, the sealed region can contain an inert gas.

Embodiments of the present invention provide a proper bond between a pair of substrates that are bonded together by use of a bonding structure wafers so as to provide good adhesion there between. As such, the possibility of a separation of the bonded substrates is decreased. It is desirable to prevent such as separation between the substrates and a breaching of the sealed region there between during or after packaging or dicing because the sealed region, once breached, allows undesirable gas to enter into the sealed region from the ambient. This undesirable gas can cause problems in several ways. The gas entering into the sealed region can cause the pressure inside the sealed region to be other than as designed such that devices of the die that require a high vacuum and/or a low pressure environment will malfunction. For example, a field emission device emits electrons that can collide with gas molecules in an undesirable gas that enters into the sealed region. The collision of the electrons with these gas molecules causes the electrons to scatter or to create ions that can cause damage to the integrated circuits in the die. The gas molecule-electron collisions can also cause the electron beam emitted by the field emission device to be lacking in proper focus. Accordingly, embodiments of the present invention provide a bonding process that increases the integrity such that the substrates are less likely to separate one from another, thereby providing a good bond between substrates so as to prevent a breaching of the sealed region there between, such as in wafer level packaged die.

Each of the bonded substrates can be a semiconductor substrate. The term "semiconductor substrate" includes semiconductive material. The term is not limited to bulk semiconductive material, such as a silicon wafer, either alone or in assemblies comprising other materials thereon, and semiconductive material layers, either alone or in assemblies comprising other materials. The term "substrate" refers to any supporting structure including but not limited to the semiconductor substrates described above. A substrate may be made of silicon, glass, gallium arsenide, silicon on sapphire (SOS), epitaxial formations, germanium, germanium silicon, diamond, silicon on insulator (SOI) material, selective implantation of oxygen (SIMOX) substrates, and/or like substrate materials. Preferably, the substrate is made of silicon, which is typically single crystalline.

Each of the bonded substrates can be a silicon wafer. In wafer bonding, two or more wafers are bonded together each of which can have a plurality of electrical devices formed thereon prior to the wafer bonding process. After the wafers are bonded together, they can be packaged. Bonded wafers, once packaged, are then singulated into individual die. Typical dice resulting from such a process include devices such as MicroElectroMechanical Systems (MEMS).

Packaging bonded wafers is a cost savings over packaging individual die. Due to the high costs of die-level packaging, wafer-level packaging is viewed as desirable for MEMS products. Common aspects for MEMS device dice include electrical interconnections between wafers, a fixed gap spacing distance between adjacent wafers, and a hermetic or gas impervious seal to maintain a specific environment such as a vacuum, a specific gas, or protection from gases that are in the ambient or external environment. The constraint of maintaining a specific environment is significant for atomic resolution storage devices, field emitter displays, or other highly integrated components made on multiple wafers.

The Figures depict various embodiments of an electrical device contemplated by the invention. In each of FIGS. 1*a*-1*b*, a film stack 102 is formed so as to include various materials and structures, including a semiconductor substrate, a plurality of integrated circuits 103, refractory metal layers such as titanium upon tantalum, interconnects, and dielectric or passivation layers. An etch stop 106, which can be composed of silicon carbide, is upon film stack 102. A top region 114 in FIG. 1*a* is formed upon etch stop 106 as either a graded or implantable material, such as a dielectric or a metal. In one embodiment, when top region 114 is a graded material, there is a bottom component 120 and an upper component 122 that differ in composition. For instance, in a particular embodiment bottom component 120 can be rich in silicon nitride and lean in silicon dioxide, where as upper component 122 can be rich in silicon dioxide and lean in silicon nitride. Stated otherwise, in another particular embodiment the formation of top region 114 can begin with a deposition of a composition of $Si_{X1}O_{Y1}N_{Z1}$. Oxygen and nitrogen are varied during the formation of top region 114. At the end of the formation of top region 114, the deposition has a composition of $Si_{X2}N_{Y2}O_{Z2}$. For example, if X1=1, Y1=2, and Z1=0 at the start of the formation of top region layer 114 and X2=3, Y2=0 and Z2=4 at the end of the formation of top region 114, then top region 114 would grade from $SiO_2$ to $Si_3N_4$. In one particular embodiment top layer 114 can be formed as a graded layer by a deposition that is first rich in a first component and lean in a second component, and then transitioning in composition to a combination during the deposition process that is lean in the second component and rich in the second component. In this particular embodiment such a deposition process can be performed in a single deposition tool.

Figure 2:
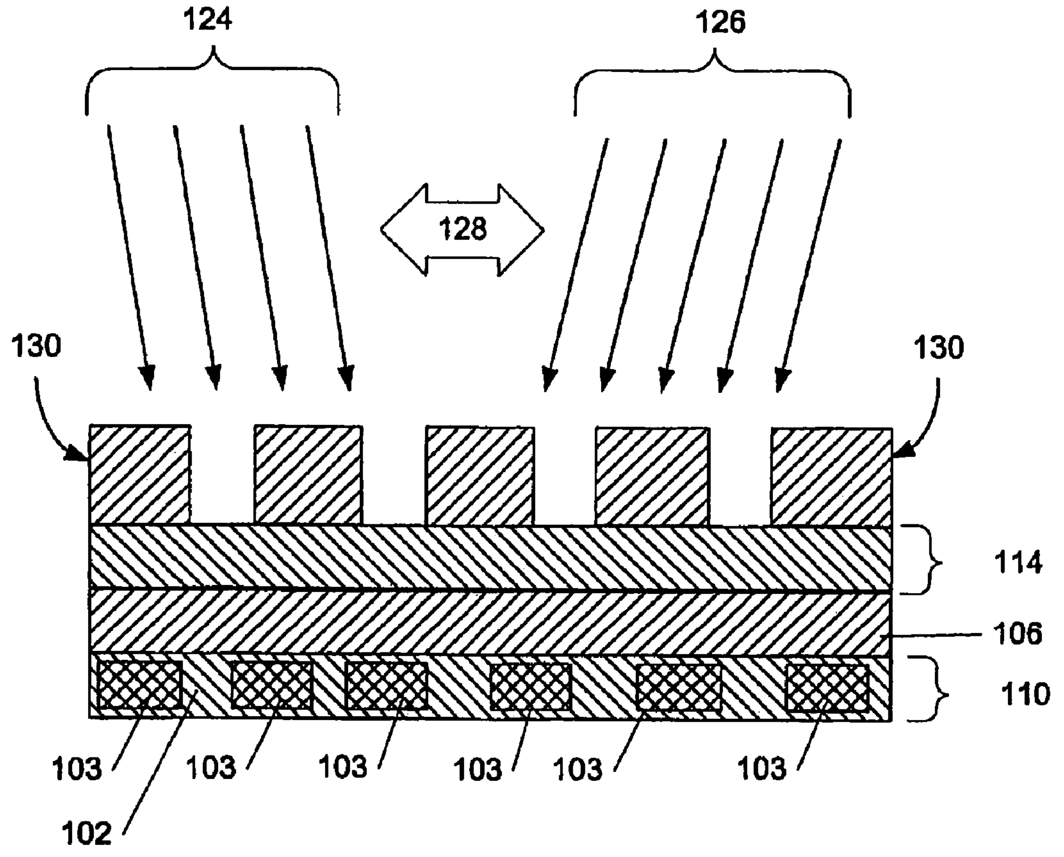
FIG. 2 is a cross-sectional cutaway view of an embodiment of the invention depicting a portion of a masked wafer having fabricated therein a plurality of integrated circuits and that is to be bonded to another wafer using a masked layer there on that is being directionally implanted and is to be etched so as to provide good adhesion to the other wafer.
Figure 3A:
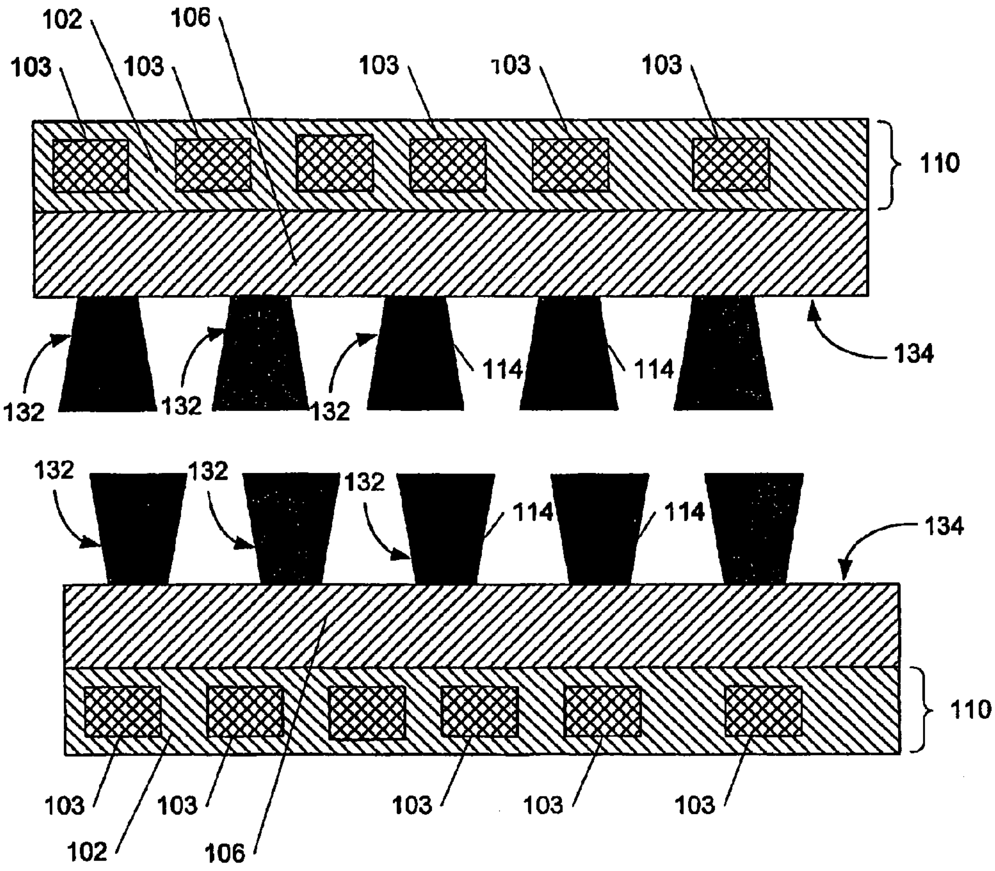
FIG. 3*a* shows a cross-section cutaway view of two portions of two wafers, either of which could be the portion of the wafer seen in FIG. 1*a* or FIG. 2 after one embodiment of further processing, where a dove tail bonding structure that has been fabricated on the portion of the wafer is to be aligned for bonding to another such dove tail bonding structure on a portion of another wafer.

In one embodiment following the deposition of the graded layer, top region 114 is patterned. In one embodiment the patterning of top region 114 can be accomplished by a masking process, such as a mask 130 seen in FIG. 2. In one embodiment after mask 130 is applied, an etch process can be conducted with an etchant that is selective to the first component and is not selective to the second component. As such, the etch process will stop on etch stop 106 and the etchant will remove less of upper component 122 and more of bottom component 120. In one embodiment the resultant structure is an undercut structure that is seen in FIG. 3*a*, where the undercut forms a beveled surface from top region 114. The angle of the bevel with respect to a base surface 134 on etch stop 106 is a function of the composition of the graded material, processing variables, and the subsequent etch recipes. In one embodiment preferably, a dove tail bonding structure 132 will be formed so as to project from top surface 134 of etch stop 106. The term "dove tail", as used herein is intended to mean a pair of planar surfaces that form, respectively, acute and obtuse angles with a base surface of a layer.

Figure 1B:
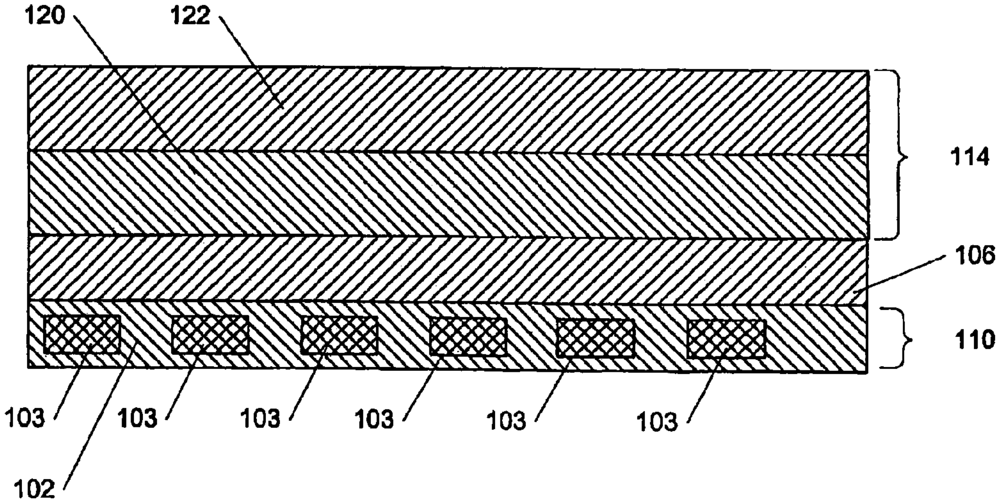
Figure 3B:
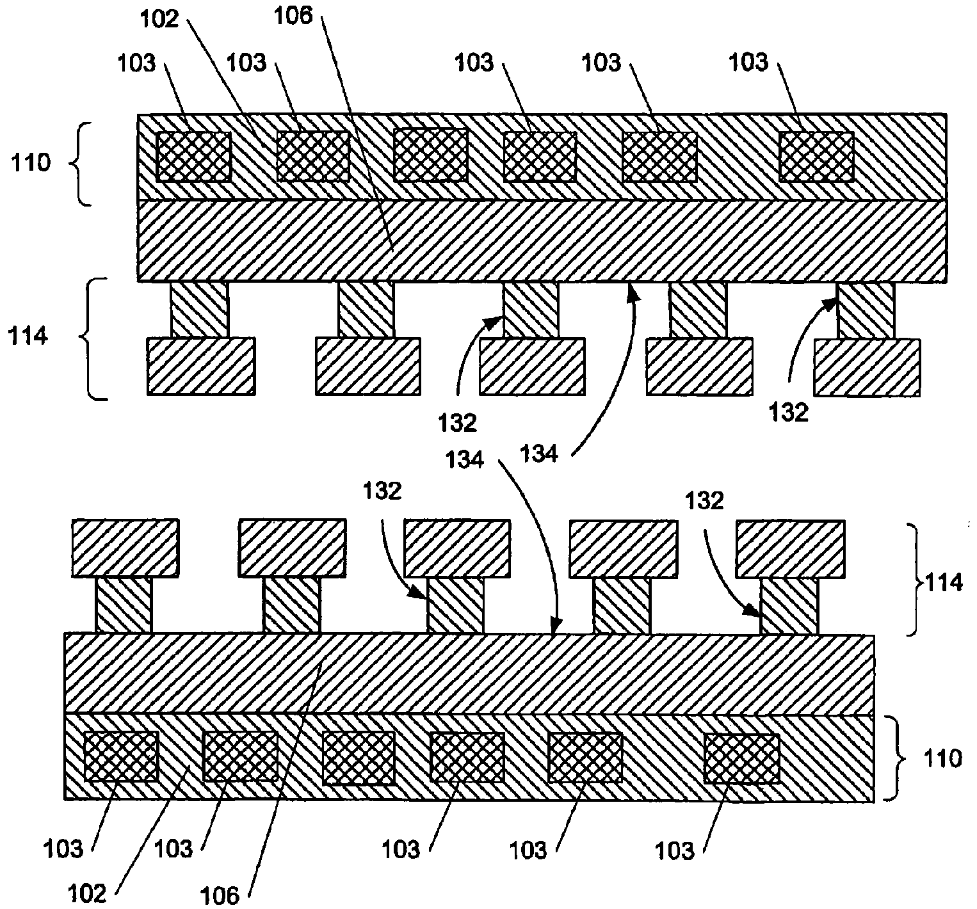
FIG. 3*b* shows a cross-section cutaway view of the portion of the wafer seen in FIG. 1*b* after one embodiment of further processing, where a 'T-shaped' bonding structure that has been fabricated on the portion of the wafer is to be aligned for bonding to another such 'T-shaped' bonding structure.

In a particular embodiment seen in FIG. 1*b* top region 114 is a graded stack. In one embodiment the graded stack can be represented as a pair of layers of respectively different materials, such as where bottom component 120 is composed of silicon dioxide and upper component 122 is composed of silicon nitride. In one embodiment mask 130 seen in FIG. 2 is applied upon upper component 122 seen in FIG. 1*b* and an etch process is conducted. In one embodiment the etch recipe selected will preferably undercut upper component 122 seen in FIG. 1*b* by removing less of upper component 122 seen in FIG. 1*b* and more of bottom component 120 seen in FIG. 1*b*. In one embodiment the etchant of the etch recipe will preferably stop etching on etch stop 106. In the embodiment seen in FIG. 3*b*, the resultant structure is a 'T-shaped' bonding structure formed from top region 114 upon base surface 134 of etch stop 106. The particular embodiment of the depicted bonding structure in FIG. 3*b* has orthogonal angles at a periphery thereof such that dove tail bonding structure 132 is symmetric about an axis that is perpendicular to base surface 134. The general shape of the resultant bonding structure will be a first portion having a first width that is offset from the etch stop layer and a second portion having a smaller second width that connects the first portion to the etch stop layer. In one embodiment the smaller second width is accomplished by the undercutting of the first portion by the selected etchant in the etch recipe that removes more of the material of the second portion than that of the first portion. As such, the selected etch recipe and processing variables can vary with the composition of top region 114. In one embodiment as seen in FIG. 3*b*, an inverted set of 'T-shaped' bonding structures can assume an interlocking mating position with an uninverted set of 'T-shaped' bonding structures so as to achieve a mechanical bond. In one embodiment and stated otherwise, the undercut second portion of each 'T-shaped' bonding structure on the uninverted wafer makes a conforming fit to the wider first portion on the inverted wafer.

In one embodiment FIG. 2 illustrates a process by which top region 114, which is a masked implantable material, is implanted in an implantation tool to form a graded material. In one embodiment the implantation tool is used to perform a first directional implantation 124 from one direction and then a second directional implantation 126 from a different direction. In one embodiment the regions into which the material of first and second directional implantations 124, 126 are implanted can be controlled by a movement 128 of the implantation tool with respect to mask 130. In one embodiment following the implantation, an etch process can be conducted with an etchant that is selective to the unimplanted portion of top region 114 and is not selective to the implanted portion of top region 114. In one embodiment the etchant will remove material from top region 114 along the directions of first and second directional implantations 124, 126, given the implantation mask 130, as the implantation tool undergoes movement 128. In the particular embodiment seen in FIG. 3*a* the resultant structure has a beveled surface that is formed on top region 114. The angle of the bevel between base surface 134 and top region 114 seen in the embodiment depicted in FIG. 3*a* is a function of first and second directional implantations 124, 126, movement 128, implantation mask 130, and the subsequent etch recipes. In one embodiment dove tail bonding structure 132, as seen in FIG. 3*a*, can be formed so as to project from base surface 134. In this embodiment dove tail bonding structure 132 has a pair of planar surfaces that form, respectively, acute and obtuse angles with base surface 134.

Figure 4:
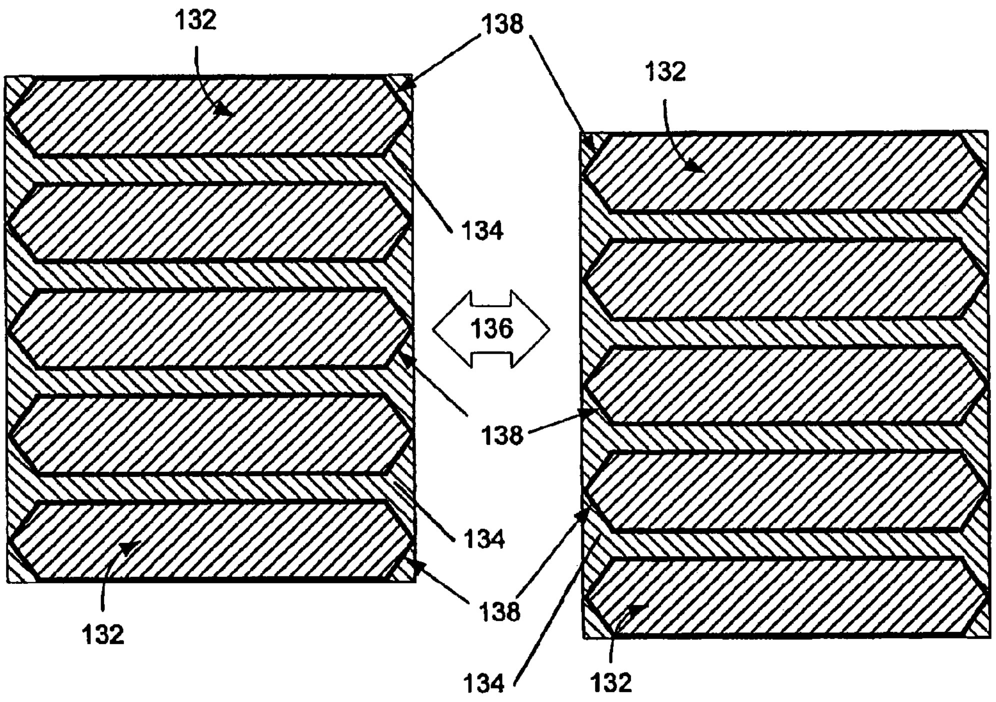
FIG. 4 shows a top planar view of the portions of the wafer seen in either FIG. 3*a* or FIG. 3*b* after one embodiment of further processing, where the respective bonding structure fabricated on a portion of the wafer is aligned for bonding to another such bonding structure on a portion of another wafer.

In one embodiment FIGS. 3*a*-3*b* shows bonding structures 132 formed on a respective pair of top regions 114, where the size and shape of each bonding structure 132 is suitable for a respective interlocking mating position one to the other. Alignment for accomplishment of the interlocking mating position is seen in FIG. 4, according to one embodiment where the bonding structure 132 is formed on the top of a film stack on a portion of a wafer. In one embodiment the film stack on each wafer seen in FIG. 4 can be the same as the thin film stack seen in FIGS. 3*a*-3*b*. In one embodiment the etch process that forms each bonding structure 132 can also form a taper 138 in top region 114 as seen in FIG. 4. In one embodiment taper 138 self-aligns the joining together of bonding structure 132 by a sliding movement 136 seen in FIG. 4. In one embodiment, taper 138 can be formed on opposing ends of each bonding structure 132.

Figure 5:
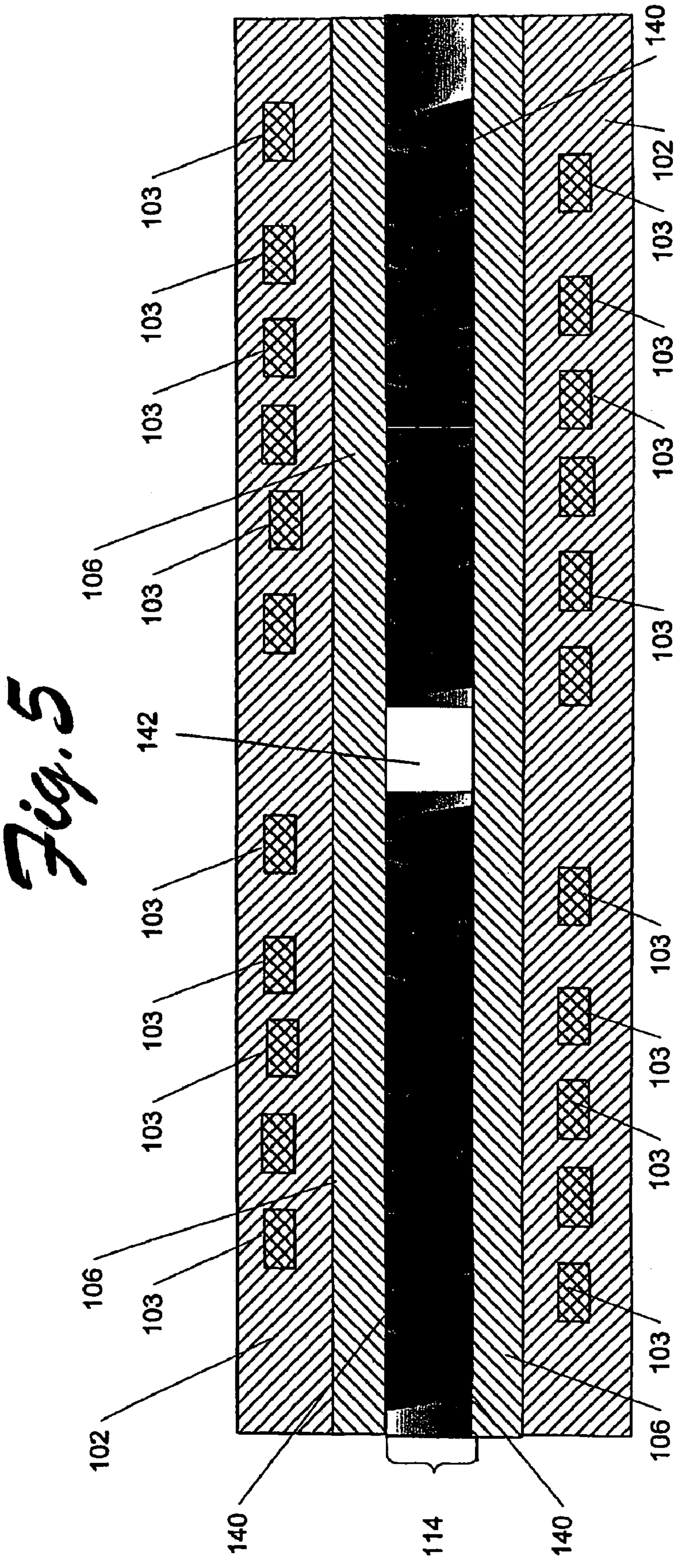
FIG. 5 is a cross-sectional cutaway view of the wafer portions seen in FIGS. 3*a* or 4 after one embodiment of alignment, where the dove tail bonding structure on each portion of each wafer bonds the wafer portions together and optionally forms a sealed region between the bonded wafer portions.

In one embodiment, as seen in FIG. 5, an interlocking mating position is assumed by the respective dove tail bonding structures 132 on each portion of each wafer. In one embodiment a sealed interface 140 can be formed between each respective interface between bonding structures 132. In one embodiment the interlocking mating position forms sealed region 142, which can be a gas impervious region, a hermetically sealed region, or can be filled with an inert gas as the wafer portions are bonded one to the other. As can be seen in the particular embodiment of FIG. 5, each of film stack 102 has integrated circuits (ICs) region 103 fabricated thereon. By way of example, the pair of film stacks 102 seen in FIG. 5 can be portions of a pair of semiconductor wafers that are packaged at the wafer level and diced. In one embodiment sealed region 142, which can be formed between the wafer portions during the bonding process, can be exposed to ICs 103, either directly or through a passageway (not shown) in fluid communication with ICs 103.

In one embodiment the interlocking mating position of each dove tailed bonding structure 132 provides strong physical bonding that resists separation of the portions of the wafers. Additionally, in another embodiment, a coating can be applied to sealed interface 140, such as by chemical vapor deposition (CVD) or other conventional deposition technique. In one embodiment the coating can help to seal out undesired gasses from sealed region 142 and/or assistance in the mutual adhesion of top regions 114 seen in FIG. 5.

Both the formation of the coating and the process of bonding the portions of the wafers together, in one embodiment t, can include a heat treatment such as an annealing process. In one embodiment the heat treatment can be conducted at temperatures at or below approximately 450 degrees Celsius. In one embodiment an annealing chamber can be used to accomplish the bonding process. Although not necessary for implementing the invention, it may be preferable to change or "ramp" the temperature. By keeping these temperatures below approximately 450 degrees Celsius, any CMOS circuitry included in either of the bonded substrates should not be damaged.

In the bonding process, according to various embodiments, the portions of the wafer scan have a bond that is sufficient for the purposes of the present invention when it is capable of maintaining an alignment of adjacent portions of the wafers with respect to each other during normal operation of the electrical device. As such, after the bonding process, the bond can be sufficient to keep the bonded portions of the wafers attached and aligned as well optionally being configured to form an electrical connection between the integrated circuits in the respective substrates. One skilled in the art should realize that a variety of temperatures, times, and pressures are possible for the bonding process.

It should be recognized that, in addition to the bonded substrate embodiments described above, this invention is also applicable to alternative bonded structure technologies including die fabricated therefrom, such as a die encapsulating a closed environment or hermetic sealed atmosphere inside thereof, and MEMS devices that can be formed by the foregoing process.

The embodiments of the present invention disclosed herein for forming bonded substrate structures, and packaged die therefrom, can be fabricated using known process equipment in a semiconductor fabrication operation and can allow for a broad range of materials and dimensions for said structures.

In another embodiment of the invention seen in FIG. 5, one the top regions 114 can have a dove tail bonding structure formed thereon, and the other of the top regions 114 can be deposited or otherwise formed over the dove tail bonding structure so as to have good step coverage thereon, such as by Chemical Vapor Deposition (CVD). Then, the other depicted structures, seen at reference numerals 106, 102 seen in FIG. 5, can be formed over the conformal layer according to embodiments of the invention.

Figure 6:
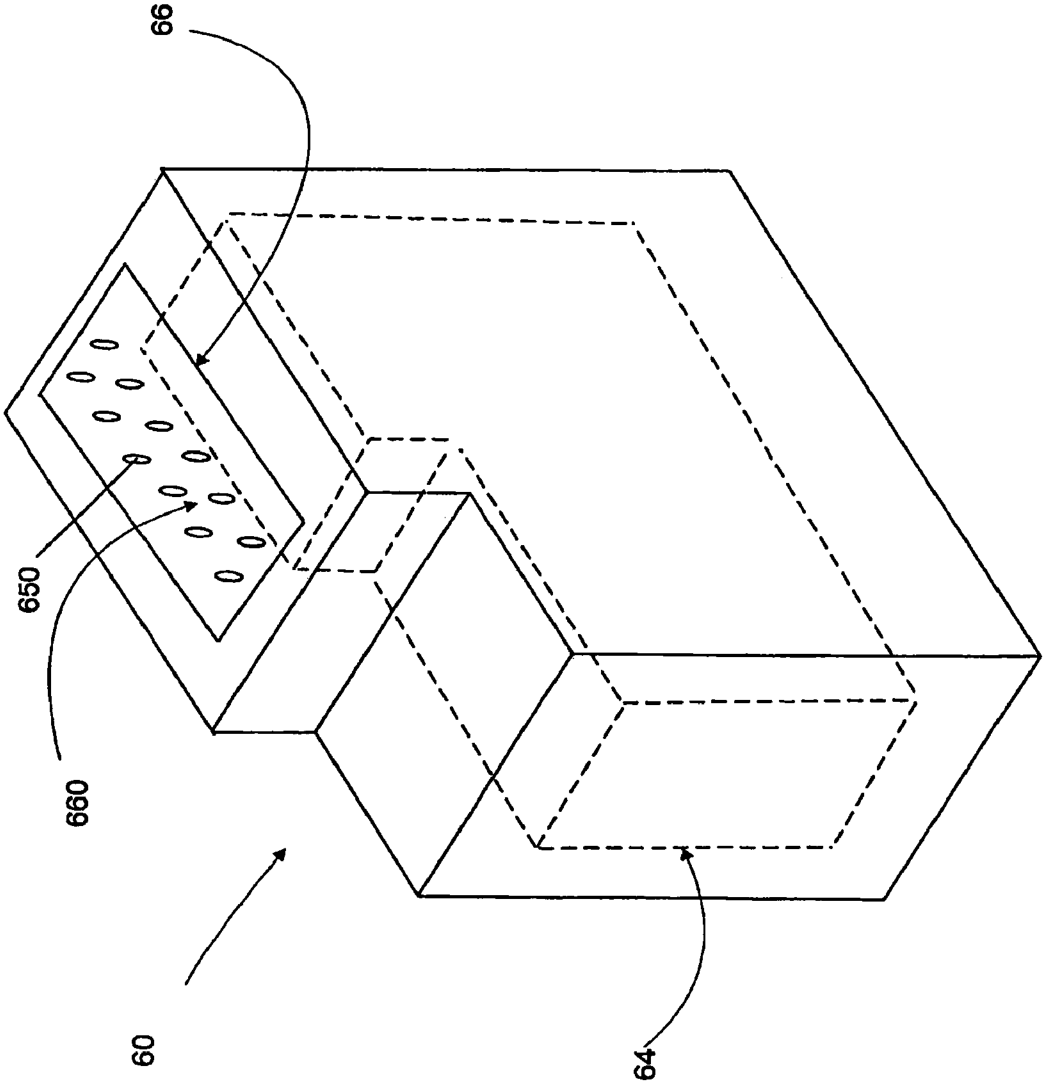
FIG. 6 is a perspective view of an embodiment of a print cartridge having an ink jet printhead.

In one embodiment FIG. 6 illustrates a print cartridge 60 of the present invention. A printhead 66 is a component of the print cartridge 60 and is seen on a surface thereof. A fluid reservoir 64, depicted in phantom within print cartridge 60 in FIG. 6, contains a fluid that is supplied to printhead 66. A plurality of nozzles 650, which are openings in nozzle plate 660 on printhead 66, are also seen in FIG. 6. In one embodiment printhead 66 can be a semiconductor device that used in the field of thermal ink jet (TI) printing. TIJ printing can involve a fluid ejection device, such as printhead 66 seen in FIG. 6. The printhead is fabricated as a semiconductor die that is composed of a plurality of thin films. The thin films are underneath a firing chamber that is often composed of an organic material. The firing chamber is heated to vaporize a volume of ink that is ejected through a nozzle out of the firing chamber. The thin films over which the firing chamber is situated typically include a cavitation layer, a passivation layer, and a resistor material. A barrier layer, which defines at least a portion of the firing chamber, is conventionally formed over the passivation layer which is over the resistor material. The resistor material is used to heat the firing chamber so as to vaporize ink droplets in the TIJ process. In some instances, the material surrounding the firing chamber does not adhere to, delaminates, or otherwise becomes detached from the thin film layers over the die. For instance, repeated impacts from the numerous collapsing of vaporized ink bubbles from the ejection of vaporized ink droplets from the firing chamber can cause materials surrounding the firing chamber to delaminate or otherwise become detached. When cracks are present in the thin film layers beneath the firing chamber, the ink, which is electrically conductive, can flow through the cracks or breaks and open up a passageway beneath the firing chamber into the thin films. When the ink contacts underlying electrically conductive layers, the ink can short and corrode the conductive layers, resulting in increased resistance and eventual resistor failure. In severe cases an entire power supply bus may be corroded resulting in several resistors on a printhead failing. Embodiments of the present invention provide good adhesion and prevent detachment and/or delamination of the materials surrounding the firing chamber from the underlying thin films, so as to thereby protect conductive traces and other structures in the print head die from ink corrosion.

Figure 7:
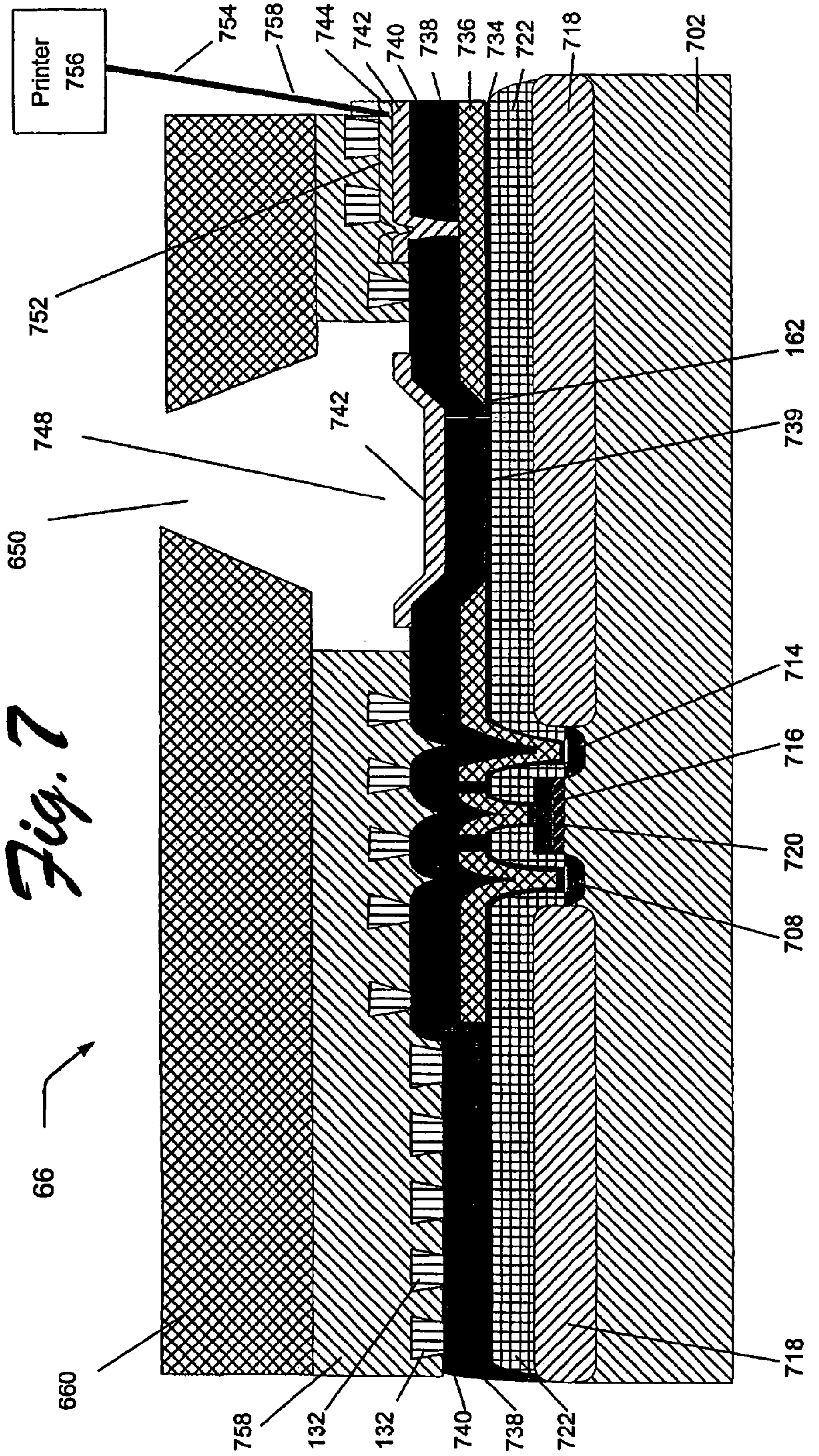
FIG. 7 is a cross-sectional cutaway view of a thermal ink jet (TIJ) printhead in accordance with one embodiment of the invention, the TIJ printhead being in communication with a thermal ink jet printer through a lead that is attached to a bond pad on the ink jet printhead, where a nozzle plate and barrier layer structure defines a firing chamber, and where the nozzle plate and barrier layer structure is adhered to the printhead by a dove tail bonding structure formed on an insulator layer.

An illustration for presenting an example of an embodiment of the invention with respect to the thermal ink jet (TIJ) printhead is seen in FIG. 7 in the cross-sectional cutaway view of printhead 66 that is fabricated by a process for forming a cavitation layer 742, a semiconductor substrate 702, and all other layers and structures there between. In one embodiment semiconductor substrate 702 can have doping, such as a P doping. In one embodiment active areas 708, 714 are within semiconductor substrate 702. In the embodiment seen in FIG. 7 a field oxide region 718 is adjacent to active areas 708, 714, and a gate 720 is upon a gate oxide 716. A BPSG layer 722 is over semiconductor substrate 702. In one embodiment a resistor material 734 can be composed of an alloy of tantalum and aluminum and has a resistor portion 739. The resistor material 734, which one embodiment can be a relatively thin film, is formed using thin film techniques where a conductive material, such as tantalum aluminum, is deposited over a substrate and is etched to form a desired resistor. In one embodiment a first metal layer 736, typically composed of an aluminum-copper alloy, is upon resistor material 734. In one embodiment a first insulator layer 738 is upon first metal layer 736 and a second insulator layer 740 is upon first insulator layer 738. In one embodiment first and second insulators layers 738, 740 are typically composed of $Si_3N_4$ and SiC, respectively.

Cavitation layer 742, which can be composed of a tantalum-aluminum alloy in one embodiment, is upon second passivation layer 740. In one embodiment a noble metal, such as gold, is used to form an electrical contact 744 and is upon cavitation layer 742.

In one embodiment a plurality of bonding structures 132 are formed upon second passivation layer 740 and serve to provide adhesion for a barrier layer 758. In one embodiment barrier layer 758 can be formed by depositing a material which is typically composed of an organic material, such as polyamide. Bonding structures 132 can be formed in a manner similar to that discussed above with respect to FIGS. 1*a*, 1*b*, and 2, 3*a*, and 3*b*. A nozzle plate 660 is then formed over barrier layer 758. In one embodiment nozzle plate 660 can be formed from polyamide or a nickel composition. In an alternative embodiment of the invention, barrier layer 758 and nozzle plate 660 can be one integral piece and can comprise a fast cross-linking polymer such as photoimagable epoxy (such as SU8 developed by IBM), photoimagable polymer or photosensitive silicone dielectrics, such as SINR-3010 manufactured by ShinEtsu™.

In one embodiment cavitation layer 742, barrier layer 758, and nozzle plate 660 define a firing chamber 748 having nozzle 650 providing an opening thereto. Electrical contact 744 is upon cavitation layer 742. Ink jet printhead 66 seen in FIG. 7 is in communication with a thermal ink jet printer 756 through a lead 754 to electrical contact 744.

In one embodiment, bonding structures 132 provides desirable adhesion to barrier layer 758. In this particular embodiment this adhesion withstands the repeated impacts from the numerous collapses of vaporized ink bubbles from the ejection of vaporized ink droplets from the firing chamber 748, thereby avoiding the delamination and the detachment of the material of which the firing chamber 748 is composed.

Figure 8:
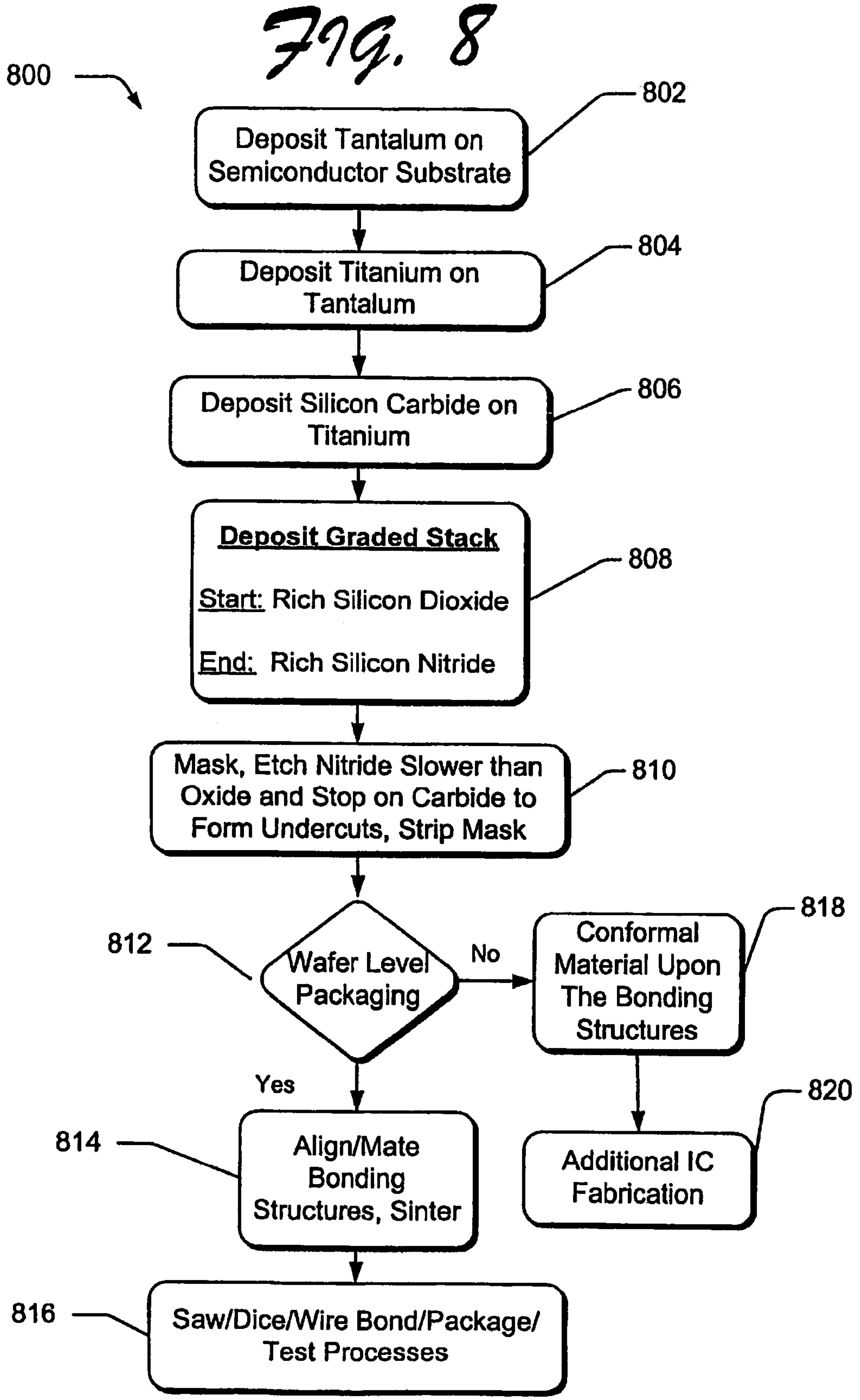
FIGS. 8-9 depict respective flow charts each illustrating embodiments of processes that can be used to fabricate a bonding structure on a portion of a wafer to be bonded to a portion of another wafer, where the other wafer has a conforming bonding structure or a conformal material that is formed over the bonding structure, followed by saw/dice/wire bond/package/test processes for the devices formed in the resultant structures.
Figure 9:
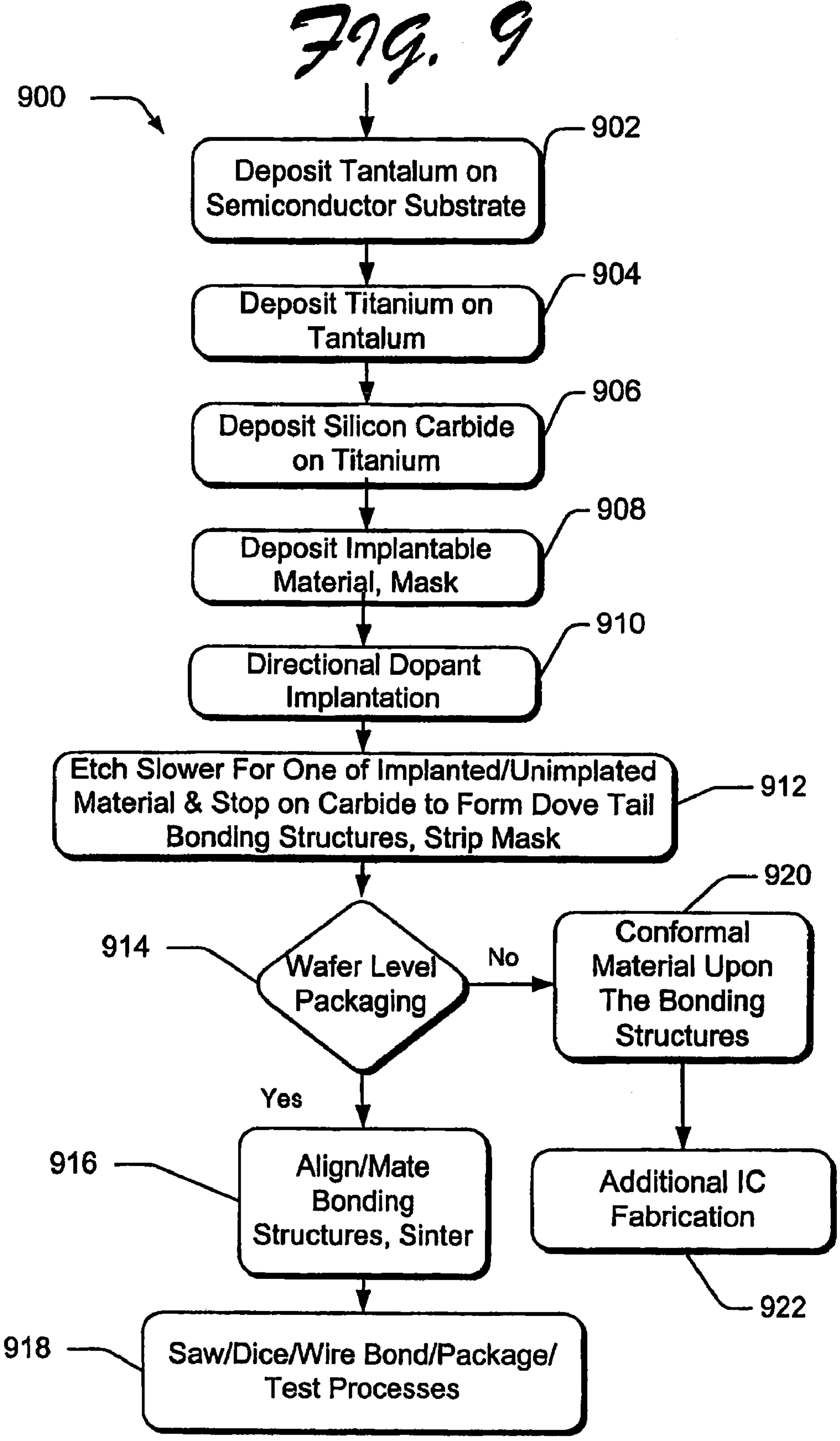

In one embodiment the bonded portions of the wafers seen in FIG. 5 can be fabricated using a substrate fabrication, bonding and packaging processes 800, 900 seen in FIGS. 8-9, respectively. FIG. 8 depicts a process according to one embodiment in which is formed the graded dielectric of bottom and upper components 120, 122 in top region 114 seen in FIGS. 1*a*-1*b*. FIG. 9 depicts a process according to one embodiment in which is formed the implanted top region 114 seen in FIG. 2.

Prior to steps 802, 902 of FIGS. 8-9, respectively, according to one embodiment ICs are fabricated in one or more of semiconductor substrates that are to be bonded together as part of a film stack. Then according to one embodiment, at steps 802, 902 and 804, 904 of FIGS. 8-9, respectively, a deposit is made of various materials to complete the film stack, such as titanium on tantalum. At steps 806, 906 of FIGS. 8-9, respectively, according to this embodiment, a deposit is made of silicon carbide on the titanium as an etch stop.

In the embodiment at steps 808 of FIG. 8, a deposit is made of a graded material, preferably in progressively changing composition, where the initial stage is rich in silicon nitride and lean in silicon dioxide, and the final stage of the deposition is rich in silicon dioxide and is lean in silicon nitride. At step 810 of FIG. 8, masking and an etch process is conducted with an etchant recipe that etches silicon dioxide selective to silicon nitride and that stops etching on the silicon carbide etch stop. In one embodiment the etch process removes more silicon dioxide that silicon nitride. Examples of the resultant bonding structure are seen at reference numeral 132 in FIGS.

3*a*, 3*b*, and can include a taper at opposing ends thereof as discussed above. In one embodiment the mask can be removed after the etch process is conducted.

In one embodiment at steps 908 of FIG. 9, implantable material is deposited. An implantation mask is then formed upon the implantable material that will be used to define dove tail bonding structures. In this embodiment at step 910 of FIG. 9, the implantable material is implanted through the implantation mask. At step 912, an etch process is conducted that has a lower material removal rate for one of the implanted or unimplanted material and has a higher material removal rate for the other of the implanted/unimplanted material. An etch stop is provided for the etch process by the silicon carbide. In one embodiment the implantation mask can then be stripped. The implantation directions and mask, as seen in the embodiment depicted in FIG. 2, can be designed to form both a dove tail bonding structure and a taper at opposing ends of the dove tail bonding structure.

In one embodiment at steps 812, 914 of FIGS. 8-9, respectively, if portions of wafers that have been formed are to be packaged at the wafer level, then wafer bonding proceeds at respective steps 814, 916 for alignment and mating of substrate pairs. In one embodiment additionally bonding efforts can be performed, such as heat treatment including sintering. These processes can then be followed by Saw/Dice/Wire Bond/Package/Test Processes for the bonded wafer portions at respective steps 816, 918. The processes at respective steps 816, 918 can include packaging of the bonded wafers and the wiring together of the same. As such, the bonded wafers are packaged together and electrically wired so as to place the ICs in each wafer in electrical communication. The packaged bonded wafers can then be diced to form electrical devices that can be then tested. The die or dice will be, respectively, individually or group tested for electrical integrity and/or burn in. Alternatively or in addition, in one embodiment, the testing can occur prior to dicing. As such, quality control procedures are enacted for the electrical devices in each die.

Alternatively, if wafer level packaging is not to be untaken, steps 818, 920 of FIGS. 8-9, respectively, are performed in one embodiment. In this particular embodiment at steps 818, 920, a material is conformably formed upon the bonding structure on the portions of the wafer, as described above. Preferably, the material will have good step coverage over and upon the bonding structure. An example of the conformal nature of the material to be formed in seen FIG. 7, where barrier layer 758 adheres to a plurality of dove tail bonding structures 132. Each dove tail bonding structures 132 is conformally formed so as to have good step coverage over the underlying second insulator layer 740. In one embodiment second insulator layer 740 can serve as an etch stop layer for an etch process that forms dove tail bonding structures 132 as described above. At steps 820, 918 of FIGS. 8-9, respectively, additional fabrication steps can be undertaken. By way of example, FIG. 7 shows that firing chamber 748 has nozzle 650 formed in nozzle plate 660 upon the dove tail bonding structure of barrier layer 758, thus providing an opening to firing chamber 748 and being situated above cavitation layer 742. The fabrication process then places ink jet printhead 66 in communication with thermal ink jet printer 756 through a lead 754 in electrical communication with electrical contact 744.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising bonding a pair of substrates together with a plurality of bonding structures on each said substrate, wherein:

the plurality of bonding structures on each said substrate is respectively interlocked one to the other in a mating position;

each said bonding structure is selected from the group consisting of a dove tail bonding structure and a T-shaped bonding structure; and at least one of the substrates includes an integrated circuit, wherein the bonding a pair of substrates together further comprises:

forming a layer of a material upon a stack of films over one of the substrates; and forming the plurality of bonding structures from the layer of the material, wherein forming the plurality of bonding structures from the layer of the material comprises:

masking the layer of the material;

forming both implanted and unimplanted regions in the layer of the material; and patterning the layer of the material with a process that is selective to either the implanted material or the unimplanted material, whereby there is removed one of the implanted and unimplanted regions in the layer of the material at a higher material removal rate than the other, whereby there are formed a plurality of dove tail bonding structures.

2. The method as defined in claims 1, wherein the forming both implanted and unimplanted regions in the layer of the material further comprises directional implantation.

3. A method comprising bonding a pair of substrates together with a plurality of bonding structures on each said substrate, wherein:

the plurality of bonding structures on each said substrate is respectively interlocked one to the other in a mating position;

each said bonding structure is selected from the group consisting of a dove tail bonding structure and a T-shaped bonding structure; and at least one of the substrates includes an integrated circuit, wherein the bonding a pair of substrates together further comprises:

forming a layer of a material upon a stack of films over one of the substrates; and forming the plurality of bonding structures from the layer of the material, wherein:

the forming a layer of a material upon a stack of films over one of the substrates comprises depositing the layer of the material as a graded layer; and the forming the plurality of bonding structures from the layer of the material comprises removing one components from the graded layer at a higher material removal rate than that of other components of the graded layer.

4. A method comprising bonding a pair of substrates together with a plurality of bonding structures on each said substrate, wherein:

the plurality of bonding structures on each said substrate is respectively interlocked one to the other in a mating position;

each said bonding structure is selected from the group consisting of a dove tail bonding structure and a T-shaped bonding structure; and at least one of the substrates includes an integrated circuit, wherein the bonding a pair of substrates together further comprises:

forming a layer of a material upon a stack of films over one of the substrates; and forming the plurality of bonding structures from the layer of the material, wherein forming the plurality of bonding structures from the layer of the material comprises:

forming a first layer of a first composition;

forming a second layer of a second composition upon the first layer;

masking the second layer; and etching the second and first layers through the mask so as to remove portions of the second layer at a lower material removal rate than that of the first layer, whereby there are formed a plurality of T-shaped bonding structures.

* * * * *

UNITED STATES PATENT AND TRADEMARK OFFICE

CERTIFICATE OF CORRECTION

PATENT NO. : 7,550,365 B2
APPLICATION NO. : 11/045531
DATED : June 23, 2009
INVENTOR(S) : Timothy R. Emery et al.

It is certified that error appears in the above-identified patent and that said Letters Patent is hereby corrected as shown below:

In column 7, line 12, delete "(TI)" and insert -- (TIJ) --, therefor.

Signed and Sealed this

Twenty-second Day of December, 2009

David J. Kappos

*Director of the United States Patent and Trademark Office*